(12) United States Patent
Park

(10) Patent No.: US 6,781,306 B2
(45) Date of Patent: Aug. 24, 2004

(54) ORGANIC ELECTRO-LUMINESCENCE DEVICE AND FABRICATING METHOD THEREOF

(75) Inventor: Jae Yong Park, Anyang (KR)

(73) Assignee: LG.Philips LCD Co., Ltd., Seoul (KR)

( * ) Notice: Subject to any disclaimer, the term of this patent is extended or adjusted under 35 U.S.C. 154(b) by 0 days.

(21) Appl. No.: 10/178,457

(22) Filed: Jun. 25, 2002

(65) Prior Publication Data

US 2003/0001493 A1 Jan. 2, 2003

(30) Foreign Application Priority Data

Jun. 29, 2001 (KR) .................................. P2001-0038298

(51) Int. Cl.[7] .................................................. H01J 1/62
(52) U.S. Cl. ...................... 313/505; 313/506; 257/72; 257/383; 257/761; 257/766
(58) Field of Search .......................... 257/35, 37, 38, 257/40, 59, 72, 291, 347, 383, 761, 763–766; 313/504–506

(56) References Cited

U.S. PATENT DOCUMENTS 6,160,272 A * 12/2000 Arai et al. ..................... 257/72

6,492,659 B1 * 12/2002 Yamazaki et al. ............ 257/59

FOREIGN PATENT DOCUMENTS

KR         102000001452 A        3/2000

* cited by examiner

*Primary Examiner*—Haissa Philogene
(74) *Attorney, Agent, or Firm*—McKenna Long & Aldridge LLP

(57) ABSTRACT

An organic electro-luminescence device that is adapted to improve its characteristic by using materials being different from each other and corresponding to each function for a formation of data lines, gate lines and supply voltage lines. The organic electro-luminescence device includes a plurality of gate lines for receiving scanning signal; a plurality of data lines for receiving data signal; and a plurality of supply voltage lines arranged alternatively with the data lines, wherein at least one of the gate line, the data line and the supply voltage line is a wiring formed from a metal material having a high melting point. The organic electro-luminescence device allows metal materials of high melting points for forming the gate line, the data line and the supply voltage line to be different from each other. Accordingly, the organic electro-luminescence device reduces defects that can be generated at the wiring formation. As a result, the organic electro-luminescence device can be highly productive.

20 Claims, 7 Drawing Sheets

ORGANIC ELECTRO-LUMINESCENCE DEVICE AND FABRICATING METHOD THEREOF

This application claims the benefit of Korean Patent Application No. P2001-38298 filed in Korea on Jun. 29, 2001, which is hereby incorporated by reference for all purposes as if fully set forth herein.

BACKGROUND OF THE INVENTION

1. Field of the Invention

The present invention relates to an organic electro-luminescence device, and more particularly, to an electro-luminescence device, having data lines, gate lines and voltage supplying lines formed from materials that are different from each other and corresponding to each function, and capable of enhancing its characteristics, and to a method of fabricating the same.

2. Discussion of the Related Art

Recently, there has been an increased requirement for a flat panel display device having a small possessory space independent of an enlarged display device. An electro-luminescence device is at the forefront of the flat panel display devices.

The electro-luminescence device is divided into an inorganic electro-luminescence device and an organic electro-luminescence device in accordance with the material used.

The inorganic electro-luminescence device conventionally applies a high electrical field to a light-emitting portion in order to emit light. The high electrical field accelerates electrons and allows the accelerated electrons to be impacted, thereby exciting a light emitting center. During excitation of the light emitting center, the inorganic electro-luminescence device emits the light.

The organic electro-luminescence device injects electrons from a cathode and holes from an anode into a light-emitting portion to transfer excitons from an exciting status to a base status, thereby emitting light. The electron and holes, which are injected into the light-emitting portion are combined to form the exciton.

The inorganic electro-luminescence device having the operation principle as described above requires a high voltage of 100 to 200 volts as a driving voltage because of the application of the high electric field to the light-emitting portion. The organic electro-luminescence device has an advantage that it is driven by a low voltage of about 5 to 20 volts. In light of this point, the organic electro-luminescence device is actively developed.

Also, the organic electro-luminescence device is used for a picture element (or a pixel) of a graphic display, a television image display or a surface light source, owing to its characteristics of wide viewing angle, high-speed response and high contrast. Furthermore, since the organic electro-luminescence device is thin and light and provides a high chrominance, it is adapted for a next generation flat panel display.

FIG. 1 shows an organic electro-luminescence device including gate lines GL1 through GLm and data lines DL1 to DLn arranged to cross each other on a glass substrate 10, and picture elements PE arranged at each crossing of the gate lines GL1 to GLm and the data line DL1 through DLn.

When a gate line on the gate line GL1 to GLm is enabled, each picture element PE is driven to generate light corresponding to a video signal on the data line DL.

In order to drive the electro-luminescence device, a gate driver 12 is connected to the gate lines GL1 to GLn and a data driver 14 is electrically coupled to the data lines DL1 through DLn. The gate line 12 sequentially drives the gate line GL1 through GLm. The data driver 14 applies video signals to the picture elements PE through the data lines DL1 to DLn.

The picture elements PE driven by the gate driver 12 and the data driver 14 each include an electro-luminescence cell OLED connected to a ground voltage line GND and a cell driving circuit 16 for driving the electro-luminescence cell OLED, as shown in FIG. 2. The cell driving circuit 16 is connected between the electro-luminescence cell OLED and the ground voltage line GND.

Referring to FIG. 2, the cell driving circuit includes a second PMOS TFT (P-channel Metal Oxide Thin Film Transistor) T2 connected between the electro-luminescence cell OLED and a supply voltage line VDD to drive the electro-luminescence cell OLED, and a first PMOS TFT T1 connected between the data line DL and a gate electrode of the second PMOS TFT T2 to switch the picture signal to be applied to the gate electrode of the second PMOS TFT T2, and a capacitor Cst connected between a drain electrode of the PMOS TFT T1 and the supply voltage line VDD.

In explaining an operation of the cell driving circuit in association with a driving waveform diagram of FIG. 3, the first PMOS TFT T1 is turned-on when a low input signal, i.e., a scanning signal from the gate driver 12 is applied to the gate line GL. If the first PMOS TFT T1 is turned-on, a video signal received synchronously with the scanning signal from the data line DL flows through the first PMOS TFT T1 and is charged into the capacitor Cst. The video signal has a predetermined amplitude.

The capacitor Cst connected between the drain electrode of the first PMOS TFT T1 and the supply voltage line VDD charges the video signal applied from the data line DL while the low input signal is supplied to the gate line GL. The capacitor Cst holds the video signal, which is applied from the data line and charged thereinto, during one frame. The holding operation of the capacitor Cst enables the application of the video signal from the data line DL to the electro luminescence device OLED to be maintained.

An organic electro-luminescence device having such a configuration of the picture element PE requires a number of data lines adapted for receiving each image signal such as R(Red), G(Green), B(Blue), etc.

FIG. 4 is a circuit diagram showing another configuration of the conventional picture element PE. The picture element PE of FIG. 4 includes an electro luminescence cell OLED connected to a ground voltage line GND and a cell driving circuit 26 positioned at a crossing of a data line DL and a gate line GL. The cell driving circuit 26 is connected between the electro luminescence cell OLED and the data line DL.

The cell driving circuit 26 includes a third and fourth PMOS TFT T3 and T4 forming a current mirror between the electro luminescence cell OLED and a supply voltage line VDD; a fifth PMOS TFT T5 connected between the data line DL and the gate line GL to respond to a signal on the gate line GL; a sixth PMOS TFT T6 connected between nodes of gate electrodes of the third and fourth PMOS TFTs T3 and T4, the gate line GL and the fifth PMOS TFT T5; and a capacitor Cst connected between the node of gate electrodes of the third and fourth PMOS TFFs T3 and T4 and the supply voltage line VDD.

FIG. 5 explains an operation of the picture element shown in FIG. 4. The fifth and sixth PMOS TFTs T5 and T6 are turned-on if a low input signal is applied to the gate line GL.

When the fifth and sixth PMOS TFTs T5 and T6 are turned-on, a video signal received synchronously with the scanning signal from the data line DL is charged into the capacitor Cst through the fifth and sixth PMOS TFTs T5 and T6. The video signal has a predetermined amplitude.

The capacitor Cst between the node of the gate electrodes of the third and fourth PMOS TFTs T3 and T4 charges the video signal from the data line DL while the low input signal is applied to the gate line GL. The capacitor Cst holds the video signal, which is applied from the data line DL and charged thereinto, during one frame. The holding of the capacitor Cst allows the application of the video signal from the data line DL to the electro luminescence cell OLED to be maintained.

An organic electro-luminescence device having such a configuration of the picture element PE requires a number of data lines adapted for receiving each image signal such as R(Red), G(Green), B(Blue), etc.

The video signal, which is charged into the capacitor Cst and held during one frame, is applied to the electro luminescence cell OLED so that an image (or a picture) is displayed on a display panel.

FIG. 5 is a plan view showing the construction of the gate line and the data line of the organic electro-luminescence device in FIGS. 2 and 4 crossing each other.

Referring to FIG. 5, there are data lines DL and supply voltage lines VDD arranged alternatively in the horizontal direction and gate lines GL arranged in the vertical direction.

In the case of an organic electro-luminescence device of a VGA mode having picture elements of 640×480, the gate lines GL of 480 columns are formed in the vertical direction. The data line and the supply voltage line VDD are alternatively formed in the horizontal direction of 640 rows, for displaying a mono picture. For a color picture, lines of 3840=640×3×2 are formed in the horizontal direction because of the requirement of having the data lines and the supply voltage lines for each R, G and B picture element.

As described above, since a density of the lines in the horizontal direction is higher than that of lines in the vertical direction as the number of lines in the horizontal direction is more than those in the vertical direction, there is a disadvantage that a stress increases in the horizontal direction.

The organic electro-luminescence device also radiates heat during the emission of light, thereby being continuously heated at about 70° C. Due to this, the breaking of wires at the crossings between the wires (or the crossings between the lines) is increased.

FIGS. 6A through 6D explains a step-by-step method of fabricating a gate line, a data line and a supply voltage line of a conventional organic electro-luminescence device.

Referring to FIG. 6A, a metal layer 36 is first deposited on a substrate 34 in order to form each line of the organic electro-luminescence device. The metal layer 36 is formed from a conductive material such as aluminum or an alloy of aluminum by a sputtering process, for example.

On the metal layer 36, a photo resist pattern 38 is formed as shown in FIG. 6B. The photo resist pattern 38 is produced by a process of uniformly coating a photo resist on the metal layer 36 to a desired thickness, exposing the photo resist to ultraviolet rays using a photo mask (not shown) arranged thereon, and developing the exposed photo resist by a developing solution. At this time, the exposed photo resist is subjected to ultraviolet rays, which changes the molecular structure so that it is dissolved into a material soluble by the developing solution.

The metal layer 36 exposed by the photo resist pattern 38 is etched using an etching process, such as a wet etching, using the photo resist pattern 38 as an etching mask. The metal 36 has a pattern the same as the photo resist pattern 38, as shown in FIG. 6C. In the case where the metal layer 36 is etched by a wet etching, an etchant such as an aqueous solution of $(NH_4)_2S_2O_8$ is used, for example.

The photo resist pattern 38 on the metal layer 38, which is not etched, is removed by stripping equipment after the etching process, as shown in FIG. 6D.

In such a conventional electro-luminescence device, a liner expansion in the wiring is enlarged by the heat because aluminum or an alloy of aluminum having a low resistance is used to deposit the metal layer 36. Due to this, the conventional electro-luminescence device has a disadvantage that the breaking of wiring is increased. The conventional electro-luminescence device also has another disadvantage that a crossing of two wires is broken by a chemical reaction with an etchant used to etch one of the wirings, because various wirings are formed from the same material.

SUMMARY OF THE INVENTION

Accordingly, the present invention is directed to an electro-luminescence device that substantially obviates one or more of the problems due to the limitations and disadvantages of the related art.

An advantage of the present invention is to provide an organic electro-luminescence device that is adapted to improve its characteristic by using materials different from each other and corresponding to each function for a formation of data lines, gate lines and supply voltage lines, and a method of fabricating the same.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the organic electro-luminescence device according to one aspect of the present invention includes: a plurality of gate lines for receiving scanning signal; a plurality of data lines for receiving data signal; and a plurality of supply voltage lines arranged alternatively with the data lines, wherein at least one of the gate line, the data line and the supply voltage line is a wiring formed from a metal material having a high melting point.

The metal material having a high melting point is any one of chromium, manganese, molybdenum, tungsten and tantalum.

The gate line, the data line and the supply voltage line are formed from a material different from each other.

The gate line is formed from a material having a high melting point that is high in a thermal stability.

The supply voltage line is formed from a metal having a low resistance characteristic.

The data line includes a conductive layer formed by a material different from those of the gate line and the supply voltage line.

The metal of the low resistance characteristic is any one of an alloy of aluminum and a double structure of aluminum and a metal of high melting point.

In another aspect of the present invention, the method of fabricating the organic electro-luminescence device having a plurality of gate lines for receiving scanning signal, a plurality of data lines for receiving data signal and a plurality of supply voltage lines arranged alternatively with the data lines includes: forming a conductive layer for at least one of the gate line, the data line and the supply voltage line, the conductive layer including a metal material having a high melting point.

The forming of the conductive layer includes: depositing the metal material having a high melting point on a substrate; forming a photo resist pattern on the metal material; patterning the metal material using the photo resist pattern as a mask to form a signal wiring on the substrate; and removing the photo resist pattern.

The conductive layer forms conductive layers for the gate line, the data line and the supply voltage line, the conductive layers formed from materials different from each other.

The conductive layer for the gate line includes the metal material having a high melting point.

The conductive layer for the supply voltage line is formed from any one of an alloy of aluminum and a double structure of aluminum and a metal having a high melting point.

The conductive layer for the data line is formed from a metal material having a high melting point different from those of the gate line and the supply voltage line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF THE ILLUSTRATED EMBODIMENTS

Reference will now be made in detail to the preferred embodiments of the present invention, examples of which are illustrated in the accompanying drawings.

Figure 1:
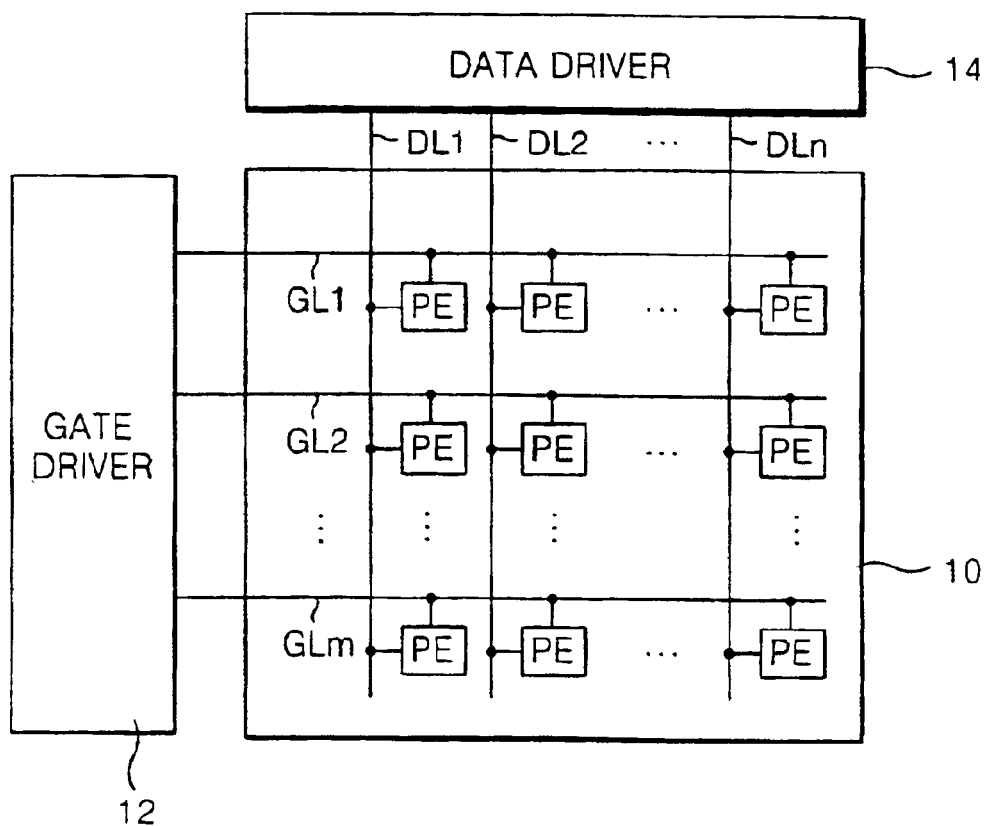
FIG. 1 is a block diagram showing a configuration of a conventional organic electro-luminescence device.
Figure 2:
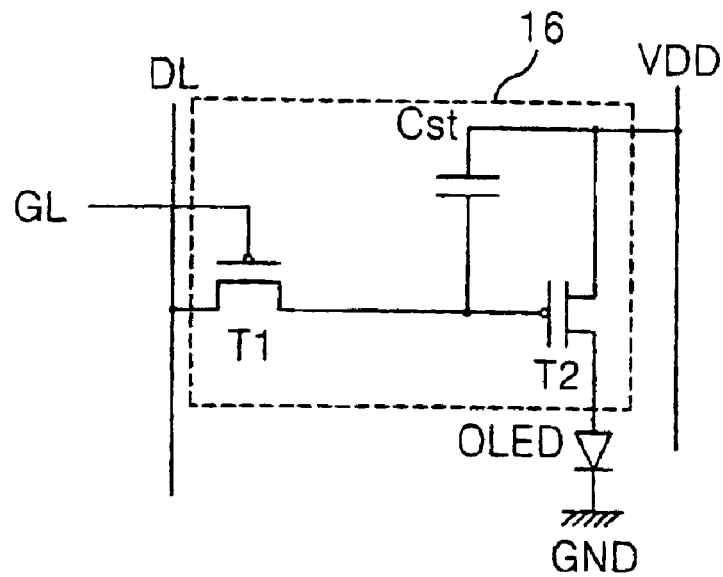
FIG. 2 is a circuit diagram showing in detail a picture element in FIG. 1.
Figure 3:
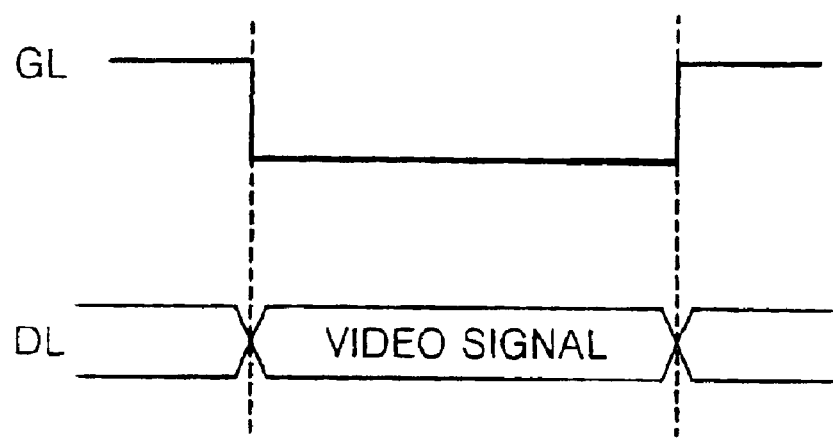
FIG. 3 is a waveform diagram showing signal to be applied to the picture element of FIG. 2.
Figure 4:
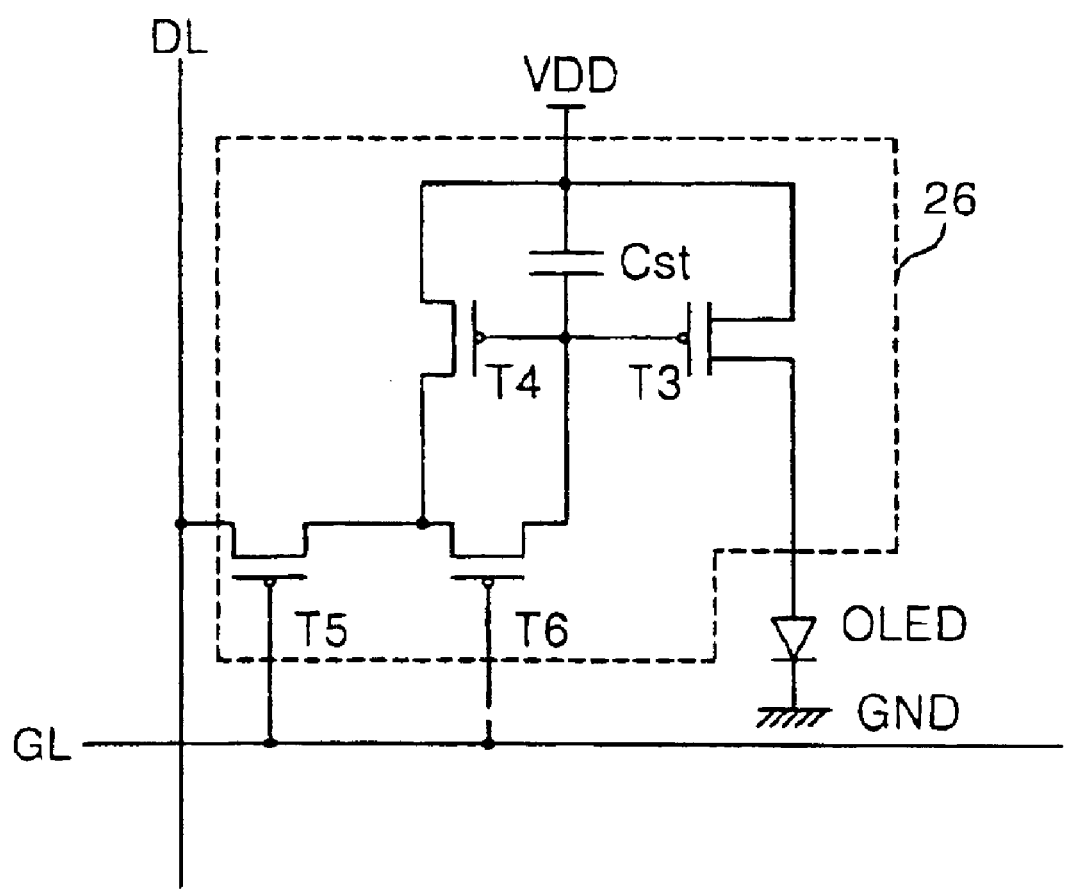
FIG. 4 is a circuit diagram showing another embodiment of the picture element in FIG. 1.
Figure 5:
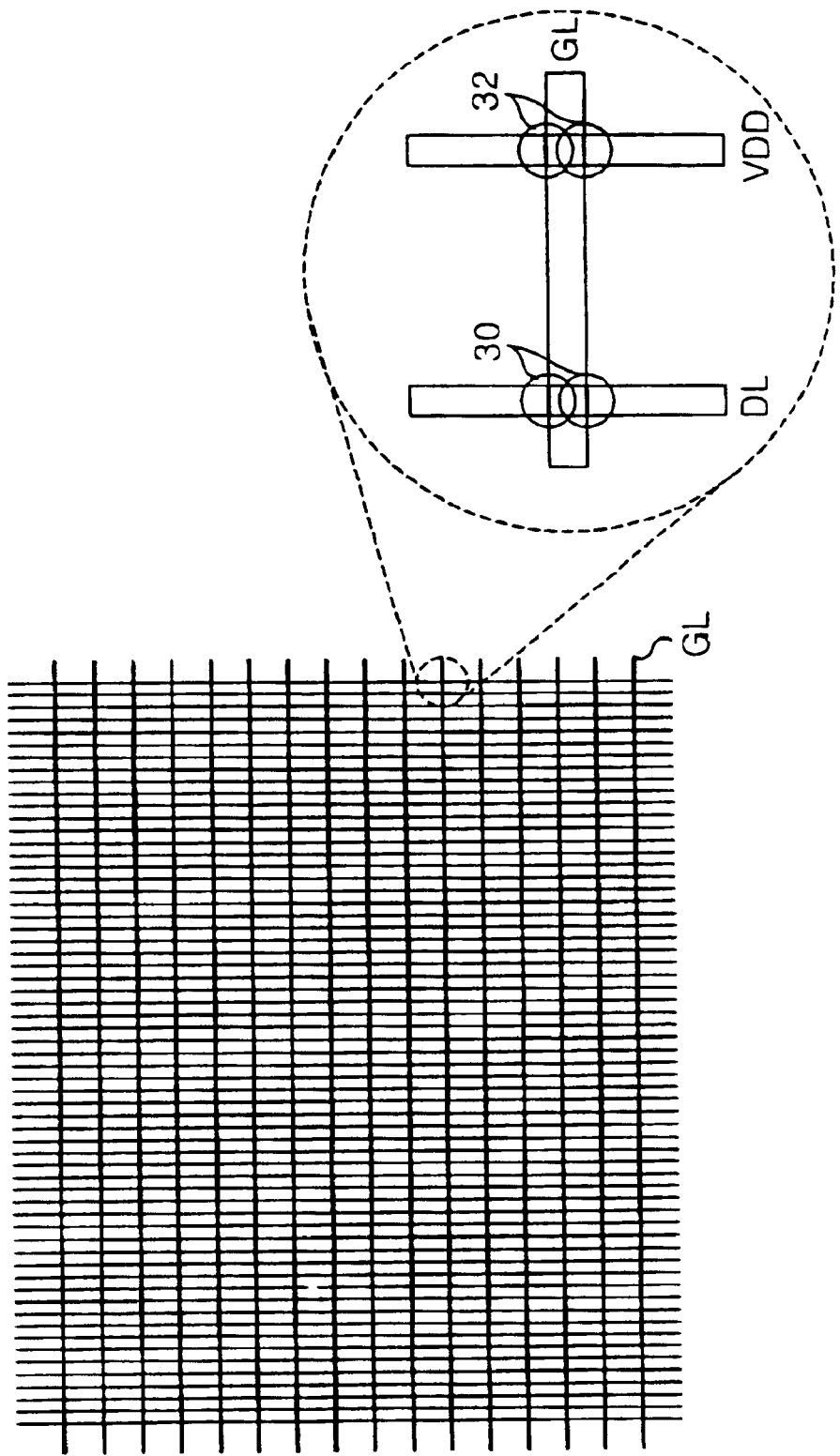
FIG. 5 is a plan view showing a configuration of wiring in an organic electro-luminescence device.
Figure 6A:
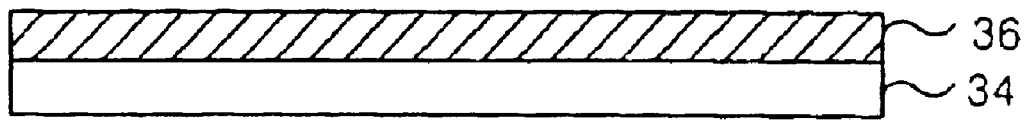
FIGS. 6A to 6D are sectional views explaining step-by-step a process of forming each wiring shown in FIG. 5.
Figure 6B:
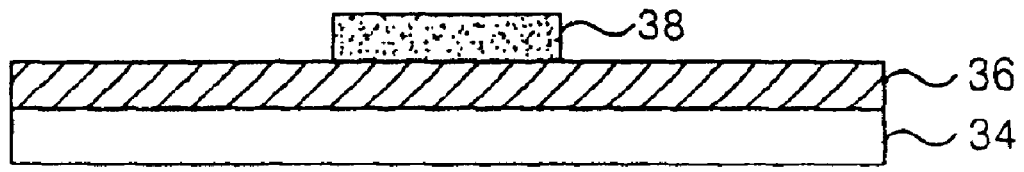
Figure 6C:
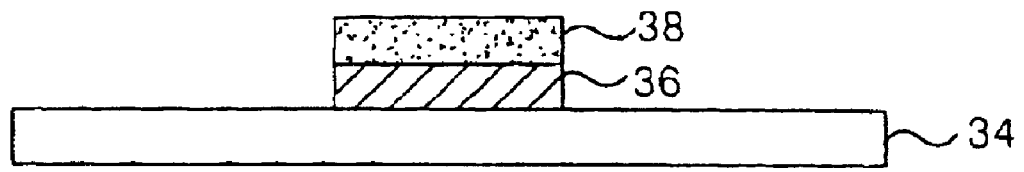
Figure 6D:
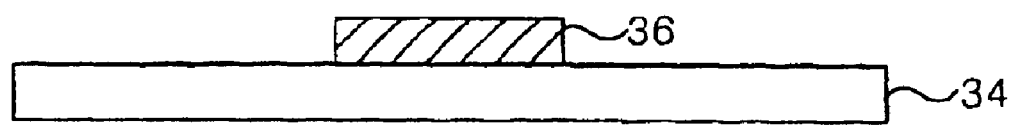
Figure 7:
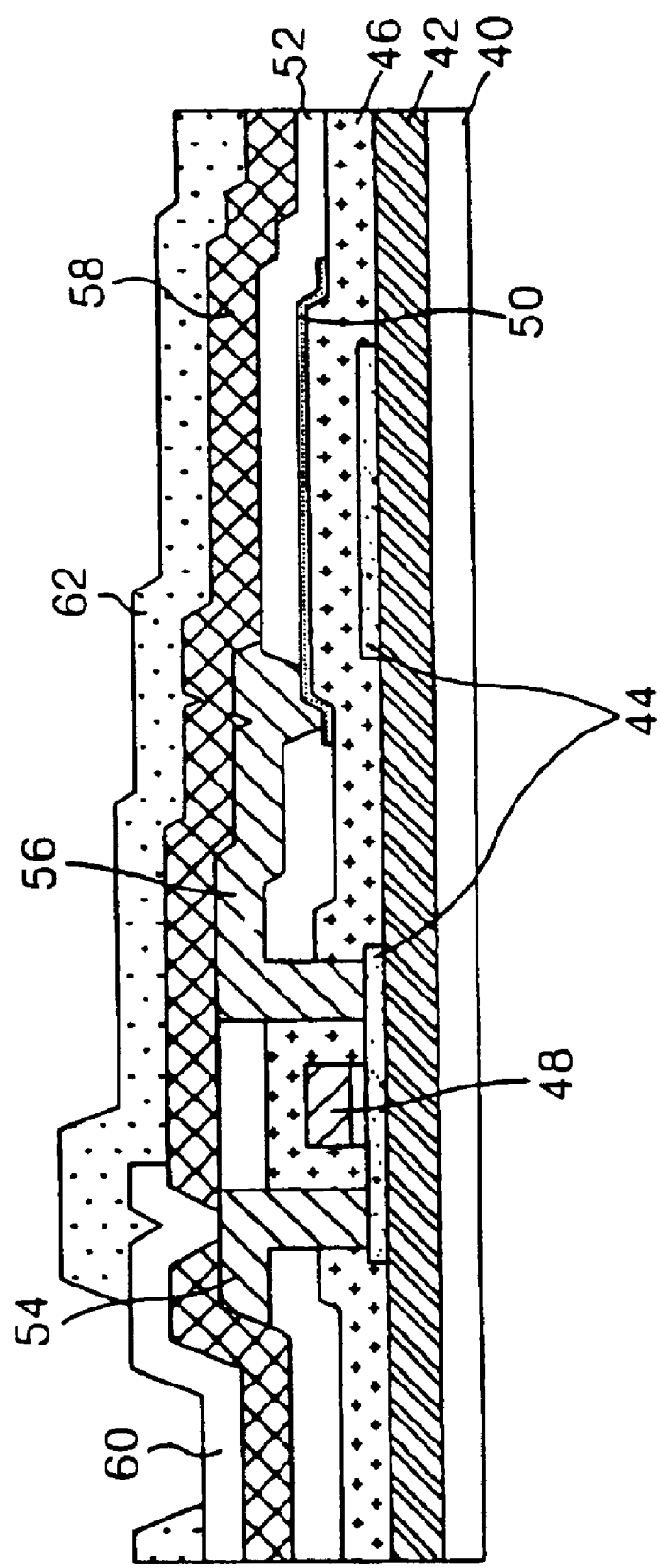
FIG. 7 is a sectional view showing a structure of an organic electro-luminescence device according to an embodiment of the present invention.

FIG. 7 is a sectional view showing a structure of an organic electro-luminescence device according to an embodiment of the present invention. Referring to FIG. 7, the organic electro-luminescence device includes an active layer 44, a gate insulating film (unlabeled) and a gate electrode 48 disposed sequentially between an interlayer insulating film 46 a buffer insulating film 42 on the transparent substrate 40; a source electrode 54 and a drain electrode 56 formed to be electrically connected to the active layer 44 through a contact hole (unlabeled) on the interlayer insulating film 46 and 52; and a data electrode (not shown) formed simultaneously with the source and drain electrodes 54 and 56. The organic electro-luminescence device further includes a protective film 58 formed on the source and drain electrodes 54 and 56 and the interlayer insulating film 52. On the protective layer 58, there is formed a transparent electrode 60 which is connected to the source electrode 54 through another contact hole (unlabeled).

FIGS. 8A through 8D explain step-by-step a process of forming a gate line, a data line and a supply voltage line of an organic electro-luminescence device according to the embodiment of the present invention.

Figure 8A:
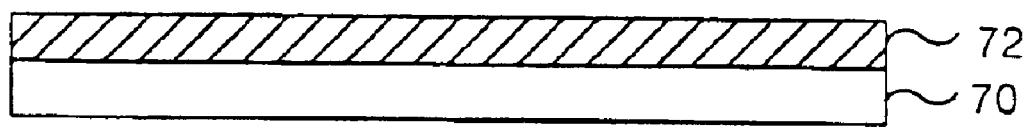
FIG. 8 are sectional views explaining step-by-step a process of forming data line, gate line and supply voltage line shown in FIG. 7.

Referring to FIG. 8A, a metal layer 72 is deposited on a substrate 70 in order to fabricate each line. The metal layer 72 is formed from a conductive material of high melting point such as chromium (Cr), manganese (Mn), molybdenum (Mo), tungsten (W), tantalum (Ta), etc., through a sputtering method, for example.

The type of metal used for metal layer 72 depends on the kind of line to be formed by it. In the case where the metal layer 72 is used as the gate line, the material forming the metal layer must be determined in consideration of the thermal stability with forming polysilicon. Therefore, the metal layer for the gate line is formed from a heat resisting material being high in thermal stability. The metal layer forming the supply voltage line must have a low resistance. In light of this point, the metal layer for the supply voltage line has a double structure of aluminum (Al) and a heat resisting material, or is formed from aluminum (Al), copper (Cu) or an alloy of aluminum (Al). The metal layer for the data line is formed from a material different from those of the gate line and the supply voltage line.

Figure 8B:
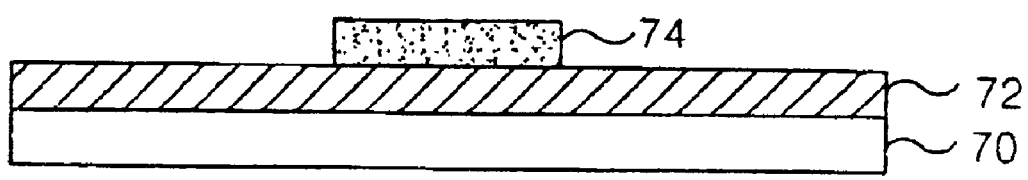

On the deposited metal layer 72, there is formed a photo resist pattern 74 as shown in FIG. 8B. The photo resist pattern 74 is produced by a process of uniformly coating a photo resist on the metal layer 72 to a desired thickness, exposing the photo resist to ultraviolet rays using a photo mask (not shown) arranged thereon, and developing the exposed photo resist by a developing solution. At this time, the exposed photo resist is subjected to the ultraviolet rays, which changes the molecular structure so that it is dissolved into a material soluble by the developing solution.

Figure 8C:
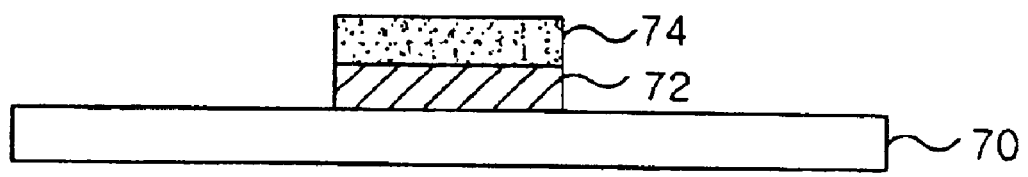

The metal layer 72 exposed by the photo resist pattern 74 is etched using an etching process, such as a wet etching, using the photo resist pattern 74 as an etching mask. The metal layer 72 has a pattern the same as the photo resist pattern 74, as shown in FIG. 8C. In the case where the metal layer 72 is etched by a wet etching, an etchant such as an aqueous solution of $(NH_4)_2S_2O_8$ is used, for example.

Figure 8D:

The photo resist pattern 74 on the metal layer 72, which is not etched, is removed by stripping equipment after the etching process, as shown in FIG. 8D. In detail, the substrate 70 is washed for removing an alien material before the photo resist pattern 74 is removed therefrom by a stripper solution sprayed from a nozzle. Spraying of an IPA solution neutralizes the stripper solution on the substrate 70. The stripper and isopropyl alcohol (IPA) solutions are washed off the substrate 70 by deionized water (DI) sprayed at a constant pressure. The substrate 70 is spin-dried in a spin dry system to remove the DI therefrom. To this end, the photo resist pattern 74 on the metal layer 72 is removed from the substrate 70.

A material having a high melting point such as chromium (Cr), manganese (Mn), molybdenum (Mo), tungsten (W), tantalum (Ta), etc., which is used in the process of forming each line, has a high combining energy itself Therefore, a material having a high melting point such as chromium (Cr), manganese (Mn), molybdenum (Mo), tungsten (W), tantalum (Ta), etc. has a high tolerance for stress produced by the heat. However, a thin film has a variation in stress according to the film forming condition. Due to this, the film obtained based upon its forming condition must be used for a wiring having a stress of below 10 Mpa. Also, since the conductive layers of each line are formed from a material different from each other, a defect in the process where the same wiring is broken by the etchant used to etch the pattern formed is reduced.

As described above, the organic electro-luminescence device according to the present invention allows metal materials of high melting points for forming the gate line, the data line and the supply voltage line to be different from each other. Accordingly, the organic electro-luminescence device reduces defects that can be generated at the wiring formation. As a result, the organic electro-luminescence device can be highly productive.

It will be apparent to those skilled in the art that various modifications and variations can be made in the electro-luminescence device of the present invention without departing from the spirit or scope of the invention. Thus, it is intended that the present invention cover the modifications and variations of this invention provided they come within the scope of the appended claims and their equivalents.

What is claimed is:

1. An organic electro-luminescence device, comprising:
   a plurality of gate lines for receiving scanning signal;
   a plurality of data lines for receiving data signal; and
   a plurality of supply voltage lines arranged alternatively with the data lines,
   wherein at least one of the gate line, the data line and the supply voltage line is a wiring formed from a metal material having a high melting point.

2. The organic electro-luminescence device according to claim 1, wherein the metal material having a high melting point is any one of chromium, manganese, molybdenum, tungsten and tantalum.

3. The organic electro-luminescence device according to claim 1, wherein the gate line, the data line and the supply voltage line are formed from a material different from each other.

4. The organic electro-luminescence device according to claim 3, wherein the gate line is formed from a material having a high melting point that is high in a thermal stability.

5. The organic electro-luminescence device according to claim 3, wherein the supply voltage line is formed from a metal having a low resistance characteristic.

6. The organic electro-luminescence device according to claim 3, wherein the data line includes a conductive layer formed by a material different from those of the gate line and the supply voltage line.

7. The organic electro-luminescence device according to claim 5, wherein the metal of the low resistance characteristic is any one of an alloy of aluminum and a double structure of aluminum and a metal having a high melting point.

8. A method of fabricating an organic electro-luminescence device including a plurality of gate lines for receiving scanning signal, a plurality of data lines for receiving data signal and a plurality of supply voltage lines arranged alternatively with the data lines, the method comprising:
   forming a conductive layer for at least one of the gate line, the data line and the supply voltage line, the conductive layer including a metal material having a high melting point.

9. The method according to claim 8, wherein the forming of the conductive layer includes:
   depositing the metal material having a high melting point on a substrate;
   forming a photo resist pattern on the metal material;
   patterning the metal material using the photo resist pattern as a mask to form a signal wiring on the substrate; and
   removing the photo resist pattern.

10. The method according to claim 8, wherein the metal material having a high melting point is any one of chromium, manganese, molybdenum, tungsten and tantalum.

11. The method according to claim 8, wherein the forming of the conductive layer forms conductive layers for the gate line, the data line and the supply voltage line, the conductive layers formed from materials different from each other.

12. The method according to claim 11, wherein the conductive layer for the gate line includes the metal material having a high melting point.

13. The method according to claim 11, wherein the conductive layer for the supply voltage line is formed from any one of an alloy of aluminum, a double structure of aluminum and a metal having a high melting point and another double structure of aluminum and copper.

14. The method according to claim 11, wherein the conductive layer for the data line is formed from a metal material having a high melting point different from those of the gate line and the supply voltage line.

15. An organic electro-luminescence device comprising:
   a transparent substrate;
   an active layer formed on the transparent substrate;
   a gate insulating film and a gate electrode disposed sequentially between an interlayer insulating film and a buffer film on the transparent substrate;
   a source electrode and a drain electrode electrically connected to the active layer through a first and a second contact hole on the interlayer insulating film; and
   a protective film formed on the source and drain electrode and the interlayer insulating film; and
   a transparent electrode connected to the source electrode through a third contact hole;
   wherein at least one of the gate electrode, source electrode, and drain electrode is a wiring formed from a metal material having a high melting point.

16. The organic electro-luminescence device according to claim 15, wherein the metal material having a high melting point is any one of chromium, manganese, molybdenum, tungsten and tantalum.

17. The organic electro-luminescence device according to claim 15, wherein the gate electrode, the source electrode, and the drain electrode are formed from a material different from each other.

18. A method of fabricating an electro-luminescence device comprising:
   depositing a metal layer on a substrate in order to fabricate a gate line, a data line, and a supply voltage line;
   forming a photoresist pattern on the metal layer;

exposing the photoresist to ultraviolet rays;

developing the exposed photoresist by a developing solution;

exposing the metal layer by etching using the photoresist as a mask;

removing the photoresist pattern, wherein the metal layer for at least one of the gate line, the data line and the supply voltage line includes a metal material having a high melting point.

19. The method according to claim 18, wherein the metal material having a high melting point is any one of chromium, manganese, molybdenum, tungsten and tantalum.

20. The method according to claim 18, wherein the metal layer for the gate line, the data line and the supply voltage line, is formed from a material different from each other.

* * * * *